(12) United States Patent
Wu et al.

(10) Patent No.: US 8,663,441 B2
(45) Date of Patent: Mar. 4, 2014

(54) VACUUM COATING APPARATUS WITH MUTIPLE ANODES AND FILM COATING METHOD USING THE SAME

(75) Inventors: Jin-Bao Wu, Hsinchu (TW); Chao-Ying Chen, Changhua County (TW); Chin-Te Shih, Hsinchu (TW); Ming-Sheng Leu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 965 days.

(21) Appl. No.: 12/548,390

(22) Filed: Aug. 26, 2009

(65) Prior Publication Data

US 2010/0213054 A1    Aug. 26, 2010

(30) Foreign Application Priority Data

Feb. 24, 2009 (TW) ................ 98105765 A

(51) Int. Cl.
*C25B 11/00* (2006.01)
*C23C 14/00* (2006.01)
*C25B 13/00* (2006.01)
*C23C 14/32* (2006.01)

(52) U.S. Cl.
USPC ............................ 204/298.41; 204/192.38

(58) Field of Classification Search
USPC ........................... 204/298.14, 192.38
See application file for complete search history.

(56) References Cited

U.S. PATENT DOCUMENTS

| | | | |
|---|---|---|---|
| 4,151,059 A * | 4/1979 | Kuehnle | 204/192.26 |
| 4,645,895 A * | 2/1987 | Boxman et al. | 219/76.13 |
| 5,006,688 A | 4/1991 | Cross | |
| 5,347,292 A | 9/1994 | Ge et al. | |
| 5,709,784 A * | 1/1998 | Braendle et al. | 204/192.38 |
| 5,725,408 A | 3/1998 | Boettcher | |
| 5,739,637 A | 4/1998 | Boettcher | |
| 6,533,908 B1 | 3/2003 | Meyer et al. | |
| 6,558,757 B1 | 5/2003 | Scheibe et al. | |
| 7,300,559 B2 | 11/2007 | Gorokhovsky | |

(Continued)

FOREIGN PATENT DOCUMENTS

| | | |
|---|---|---|
| TW | M264280 | 5/2005 |
| TW | I251623 | 3/2006 |

(Continued)

OTHER PUBLICATIONS

Dirk Basting, Klaus Pippert History and future propects of excimer laser technology 2nd Internaltional Symposium on Laser Precision Micrfab riacation Jan. 2002 pp. 1-9.*

(Continued)

*Primary Examiner* — Roy King
*Assistant Examiner* — Jenny Wu

(57) ABSTRACT

A vacuum coating apparatus is disclosed. The apparatus includes a cathode target, a plurality of anodes, a transiting device, a pulsed arc discharge device, and a pulsed laser device. The plurality of anodes is placed on the transiting device and successively passes though a working position by the transiting device. The pulsed arc discharge device is electrically connected to the cathode target and the anode at the operable position to form plasma in a vacuum chamber for film coating. The pulsed laser device is located outside of the vacuum chamber and provides a pulsed laser beam onto the surface of the cathode surface to serve as a plasma trigger. A coating method for the vacuum coating apparatus is also disclosed.

14 Claims, 2 Drawing Sheets

(56) References Cited

U.S. PATENT DOCUMENTS

| | | | |
|---|---|---|---|
| 7,435,395 B2 | 10/2008 | Durkot et al. | |
| 8,133,365 B2 * | 3/2012 | Fujii | 204/192.38 |
| 2002/0074226 A1 * | 6/2002 | Murakami et al. | 204/298.41 |
| 2007/0240982 A1 * | 10/2007 | Tamagaki et al. | 204/298.41 |

FOREIGN PATENT DOCUMENTS

| | | |
|---|---|---|
| TW | I280986 | 5/2007 |
| TW | M346607 | 12/2008 |
| TW | M347405 | 12/2008 |
| WO | WO 2007108313 A1 * | 9/2007 |

OTHER PUBLICATIONS

H.-J. Scheibe et al. "The laser-arc: a new industrial technology for effective deposition of hard amorphous carbon films", Surface and Coatings Technology 85, 1996, pp. 209-214, Elsevier, US.

H. Schulz et al. "Pulsed arc deposition of super-hard amorphous carbon films", Material Science & Processing, 2004, pp. 675-679, Applied Physics A 78, US.

China Patent Office, Office Action, Patent Application Serial No. 200910127236.0, Feb. 24, 2011, China.

Tawain Patent Office, Office Action, Patent Application Serial No. 098105765, Sep. 4, 2012, Taiwan.

* cited by examiner

VACUUM COATING APPARATUS WITH MUTIPLE ANODES AND FILM COATING METHOD USING THE SAME

This Application claims priority of Taiwan Patent Application No. 098105765, filed on Feb. 24, 2009, the entirety of which is incorporated by reference herein.

BACKGROUND OF THE INVENTION

1. Field of the Invention

The invention relates to thin film deposition, and in particular to a vacuum coating apparatus and a coating method using the same.

2. Description of the Related Art

Conventional physical vapor deposition (PVD) technology, such as thermal evaporation, e-beam evaporation, sputtering, or molecular beam epitaxy (MBE), has been utilized for thin film coating. Laser induced high current pulsed arc (LIHCPA) is a currently developed multi-functional coating technology. Unlike conventional PVD and chemical vapor deposition (CVD) technologies, the LIHCPA technology is the only coating method using a pulsed laser beam emitted into excited material (i.e. target material) from the outside of a vacuum chamber and using a pulsed arc discharge device to generate high kinetic energy particles, thus allowing various gases with high concentrations to be filled into the vacuum chamber for thin film growth. This coating technology can be applied in fabrication of high quality thin films of any single-element or compounds of amorphous, polycrystalline, and epitaxial materials.

The principal of LIHCPA technology is that a laser beam is shifted along the surface of the target material so as to induce several tiny plasma regions. Combined with a high power pulsed arc design, the pulsed laser can perform high energy ionic plasma deposition. The laser beam can scan along a vertical direction (z-direction) via a step motor, such that the range for film-forming can be increased to more than 20 cm. When the laser beam is focused on the cathode target, the anode may induce tiny plasma regions on the surface of the cathode. According to the charge and discharge mechanism of the capacitor, a pulsed current of several kiloamps (kA) can be generated during discharge, thereby inducing high energy plasma in the vacuum chamber. This high energy plasma is able to generate highly ionized with high ion kinetic energy from the target. Thus, it helps to reduce deposition temperature and surface roughness of the thin film. Moreover, since thin film deposition/coating can be performed at room temperature, flexible substrates are not damaged during the process.

However, when LIHCPA technology is used to coat a film of increased thickness or of a non-conductive material, the anode surface may be contaminated by plasma because of the long thin film deposition time. Consequently, the conductivity of the anode surface is reduced, which makes it difficult to form plasma on the cathode target by arc discharge, and the deposition thickness of the film is greatly decreased. Thus, there is a need for a better apparatus and a more effective method to produce a film of considerable thickness.

BRIEF SUMMARY OF THE INVENTION

A vacuum coating apparatus and a method for the said apparatus are described in the following embodiments with reference to the accompanied drawings. The design of multiple anodes allows the replacement of a contaminated anode during the coating process to achieve the desirable thickness of film effectively. An exemplary embodiment of a vacuum coating apparatus comprises a cathode target, a plurality of anodes, a transiting device, a pulsed arc discharge device, and a pulsed laser device. The plurality of anodes is placed on the transiting device and is transported to a working position by the transiting device. The pulsed arc discharge device, electrically connected to the cathode target and the anode at the working position, functions as a plasma inducer in a vacuum chamber for film coating. The pulsed laser device is located outside of the vacuum chamber and provides a pulsed laser beam onto the surface of the cathode surface to trigger plasma.

An embodiment of a coating method for the said apparatus is provided to solve the problem of a contaminated anode and maintain coating efficacy. The first one of the plurality anodes is transported to the working position by the transiting device, and the pulsed arc discharge device is electrically connected to the working anode and the cathode target. A laser beam is projected onto the surface of the cathode target to trigger an arc between the working anode and the cathode target to form plasma for film coating. The used anode is carried out of the working position and is replaced by a second anode of the plurality of anodes by the transiting device.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
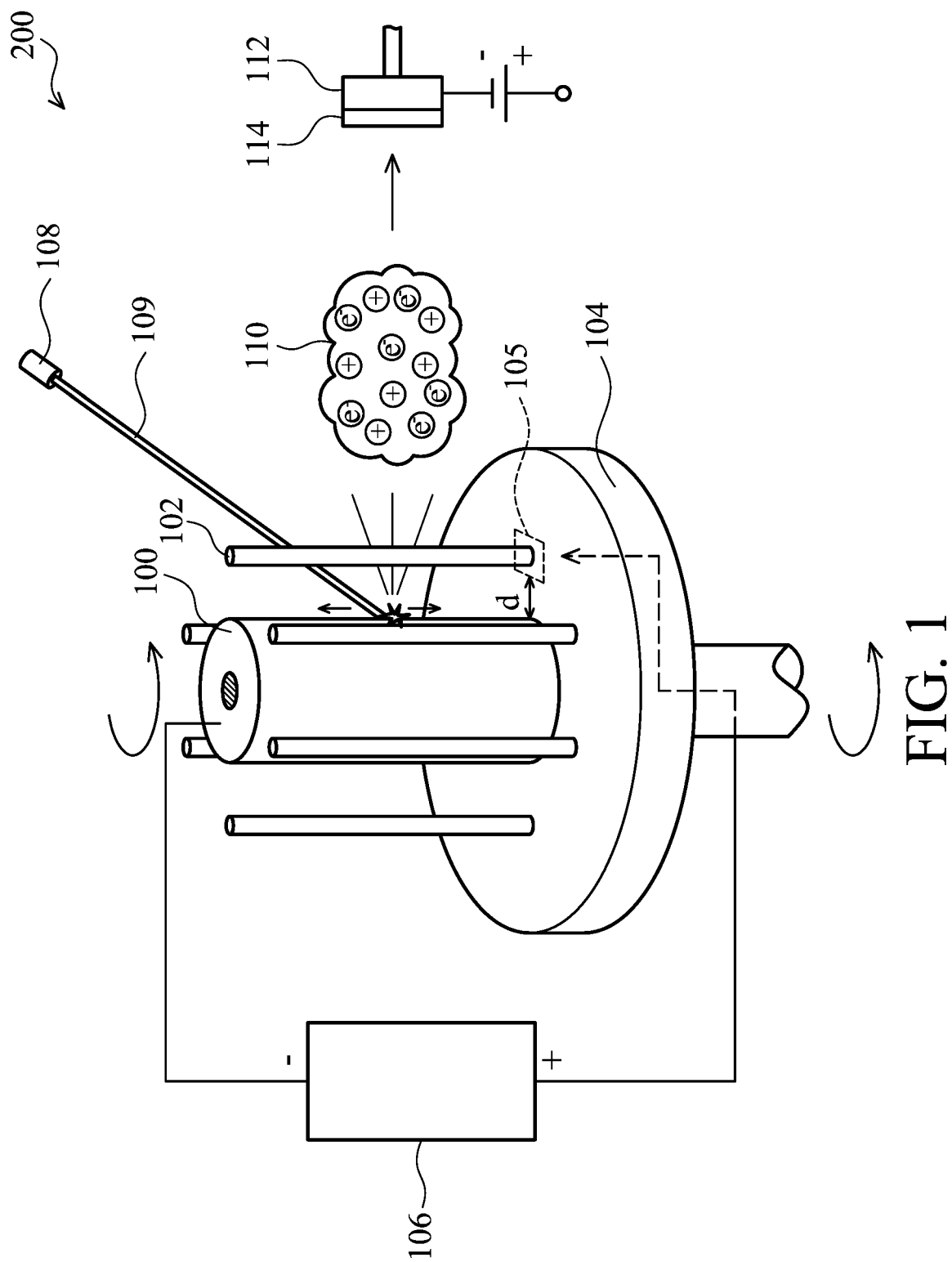
FIG. 1 is a schematic diagram of an embodiment of a vacuum coating apparatus with multiple anodes according to the invention.

Referring to FIG. 1, which illustrates an embodiment of a vacuum coating apparatus with multiple anodes according to the invention, the vacuum coating device 200 comprises a cathode target 100, a plurality of anodes 102, a transiting device 104, a pulsed arc discharged device 106, and a pulsed laser device 108. In the embodiment, the cathode target 100 has a roll-shape and is rotated along a clockwise or counter-clockwise direction with respect to a vertical axis (Note that only a counterclockwise rotation is depicted for simplifying the diagram).

The plurality of anodes 102 is placed on the transiting device 104 and is adjacent to the cathode target 100 with a specific arrangement. In the embodiment, each anode 102 is rod-shaped and has a length greater than or approximately equal to that of the cathode target 100. Moreover, each rod-shaped anode 102 may have a circular, rectangular, or polygonal cross section (Note that only a circular cross section is depicted for simplifying the diagram).

In the embodiment, the transiting device 104 has a platform positioned under the cathode target 100 for placement of the plurality of anodes 102, such that each anode 102 can be placed at a working position 105 in a clockwise or counterclockwise order. Hereinafter, the definition of "working position" is a position opposite to the surface of cathode target 100, such that arc discharge can be induced between the anode 102 and the cathode target 100 as a voltage is applied therebetween. In an embodiment, an interval d between the working position 105 and the cathode target 100 is about 0.5 cm to 5 cm and preferably about 0.5 cm to 1 cm.

Moreover, the plurality of anodes 102 placed on the platform is arranged in a ring rimmed the cathode target 100, and the transiting device 104 is rotated along a clockwise or counterclockwise direction with respect to the cathode target 100. Furthermore, it is worth to mention that the cathode target 100 and the transiting device 104 can rotate independently in same or opposite direction (Note that only a counterclockwise rotation the same as that of the cathode target 100 is depicted for simplifying the diagram).

The adjacent plurality of anodes 102 with a ring arrangement are spaced by a predetermined distance. Note that only six anodes 102 are depicted for an exemplary embodiment. The number of the anodes 102 and the spaced distance can be adjusted according to demands. Moreover, the transiting device 104 may be coupled to a step motor (not shown), such that each anode 102 is successively carried into/out of the working position 105 by the transiting device 104. In another embodiment, the transiting device 104 may be positioned above the cathode target 100 and then the plurality of anodes may be mounted on the bottom of the transiting device 104 and also rim the cathode target 100 under the transiting device 104. Additionally, in some embodiments, the plurality of anodes 102 on the platform may be arranged in a ring near the cathode target 100. Namely, the transiting device 104 may be rotated without respect to the cathode target 100. The transiting device 104, however, still needs to carry each anode 102 to the working position 105.

Typically, the pulsed arc discharged device 106 comprises a power supply and a capacitor and may be coupled between the cathode target 100 and the transiting device 104, thereby being electrically connected to the cathode target 100 and the anode 102 located at the operable position 105. For example, the cathode target 100 and the anode 102 located at the working position 105 are respectively connected to the negative potential terminal and the positive potential terminal of the pulsed arc discharged device 106, thereby inducing plasma in a vacuum chamber (not shown). In an embodiment, the pulsed arc discharge device 106 has a working voltage of about 50V to 1000V.

The pulsed laser device 108 is located outside of the vacuum chamber and serves as a plasma trigger (also known as an arc trigger). The pulsed laser device 108 is associated with the pulsed arc discharged device 106 to form an LIHCPA system. The pulsed laser device 108 provides a pulsed laser beam 109 onto the surface of the cathode target 100. In the embodiment, the pulsed laser device 108 may comprise a krypton fluoride (KrF) excimer laser device, an argon-fluoride (ArF) excimer laser device, or a neodymium-doped yttrium aluminum garnet (Nd-YAG) solid state laser device. Moreover, the pulsed laser beam 109 scans the surface of the cathode target 100 along a direction parallel to the rotating axis of the cathode target 100. Arc discharge can be induced between the cathode target 100 and the anode 102 located at working position 105 to trigger plasma 110. A negative voltage may be applied to a substrate 112 so that the plasma 110 migrates onto the surface thereof for depositing/coating a film 114 thereon.

Figure 2:
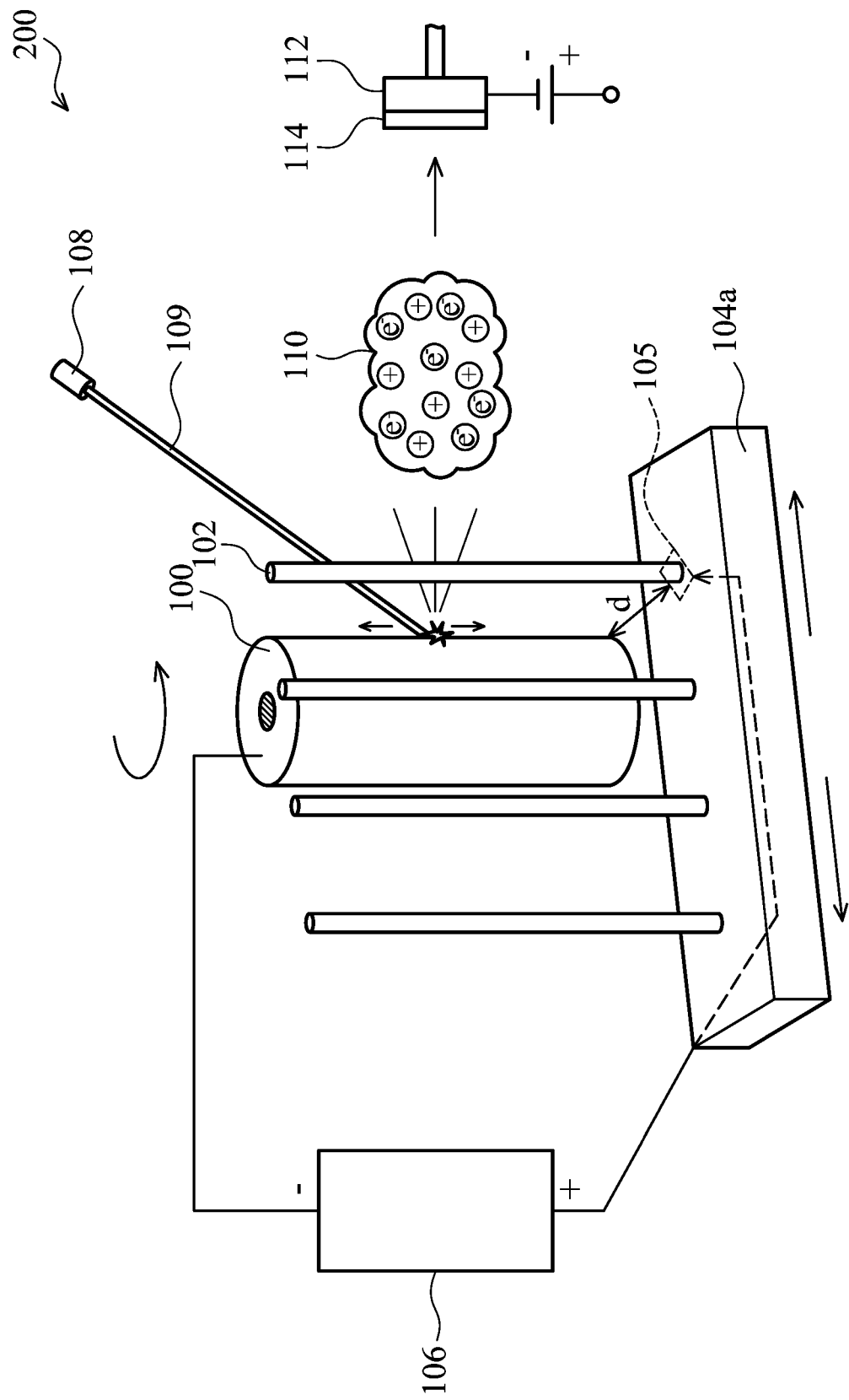
FIG. 2 is a schematic diagram of another embodiment of a vacuum coating apparatus with multiple anodes according to the invention.

FIG. 2 illustrates another embodiment of a vacuum coating apparatus with multiple anodes according to the invention. Elements in FIG. 2 that are the same as those in FIG. 1 are labeled with the same reference numbers as in FIG. 1 and are not described again for brevity. Unlike the previous embodiment of FIG. 1, the transiting device 104a is next to the cathode target 100, the plurality of anodes 102 are arranged in a straight line, and the transiting device 104 successively carries each anode into/out of the working position 105 along a linear direction. For example, the moving direction of the plurality of anodes 102 is perpendicular to the rotating axis of the cathode target 100 or the scanning direction of the pulsed laser beam 109 along the surface of the cathode target 100. Also, note that only four anodes 102 are depicted for an exemplary embodiment. The number of the anodes 102 and the spaced distance can be adjusted according to demands.

As a non-limiting example of an embodiment, a coating method is provided for the vacuum coating apparatus 200. First, an inert gas, such as He, Ne, Ar, Kr, Xe, is injected into a vacuum chamber, and the pressure is adjusted to about $1\times100^{-4}$ Pa to 2 Pa.

One of the anodes 102 is carried into the working position 105 by the transiting device 104 or 104a, such that the pulsed arc discharge device 106 is electrically connected to the anode 102 located at the working position 105 and the cathode target 100. The interval d between the working position 105 and the cathode target 100 is about 0.5 cm to 5 cm. The applied pulsed voltage (i.e. working voltage) by the arc discharge device 106 is about 50V to 1000V, thereby inducing an arc between the cathode target 100 and the anode 102.

Note that the arrangement and carrying direction of the plurality of anodes 102 is mentioned above and thus is omitted hereinafter.

The pulsed laser device 108 acts as an arc trigger to provide a pulsed laser beam 109, such as a KrF or ArF excimer laser beam or an Nd-YAG solid state laser beam, onto the surface of the cathode target 100. The pulsed laser beam 109 is utilized to induce an arc, thereby forming plasma 110 for film coating, in which the pulsed current may be more than 1000(A). Moreover, the pulsed laser beam 109 scans the surface of the cathode target 100 along a direction parallel to the rotating axial direction of the cathode target 100. A negative voltage may be optionally applied on the substrate 112, thereby the ionized ions from the cathode target 100 migrate onto the substrate 112 to form the thin film 114 thereon.

Since the anode 102 located at the working position 105 is easily consumed or covered by the particles formed from the cathode target 100, the resistance of the anodes 112 is raised and the numbers of pulsed arc discharge are reduced, resulting in limited formations of ionic plasma 110. Therefore, it is difficult to increase the thickness of the film 114.

In order to address such a problem, in an embodiment of the invention, after the anode 102 at the working position 105 is operated for a predetermined period of time, the used anode 102 is carried out of the working position 105 by the transiting device 104 or 104a, and the next fresh anode 102 is simultaneously carried into the working position 105, such that the pulsed arc discharge device 106 is electrically connected to the cathode target 100 and the fresh anode 102 with a clean surface for performing a film coating process.

In another embodiment, after a predetermined number of plasma formations is reached, the used anode 102 is carried out of the working position 105 by the transiting device 104 or 104a and is replaced by a fresh anode 102, such that the pulsed arc discharge device 106 is electrically connected to the cathode target 100 and the fresh anode 102 with a clean surface for performing a film coating process.

According to the embodiments, the vacuum coating apparatus with multiple anodes can provide a fresh anode with a clean surface for performing a film coating process as the working anode is consumed or contaminated, which results in reduction of its conductivity. Accordingly, the number of the ionic plasma formations is increased effectively and the efficiency of inducing plasma is raised, thereby increasing film depositing/coating thickness, reducing the required time for depositing a film with a predetermined thickness, and eliminating the time required for cleaning the anode. Additionally, compared with the single anode design, the multiple anode design can extend the lifespan thereof, thus materials of the lower conductivity can be used for anodes. Accordingly, the vacuum coating device with multiple anodes can be used not only for conductive film coating, but also for high resistance film coating.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A vacuum coating apparatus, comprising:
   a rotatable cathode target;
   a plurality of anodes;
   a transiting device configured to place and carry the plurality of anodes to successively pass through a working position;
   a pulsed arc discharge device electrically connected to the cathode target and the anode at the working position to form plasma in a vacuum chamber for film coating;
   a substrate arranged in the vacuum chamber to be film coated by the plasma; and
   a pulsed laser device located outside of the vacuum chamber and configured to provide a pulsed laser beam onto a surface of the cathode target to serve as a plasma trigger.

2. The apparatus of claim 1, wherein the pulsed laser beam is configured to scan the surface of the cathode target along a first direction.

3. The apparatus of claim 2, wherein the cathode target is rotatable with respect to an axis and the rotating axial direction is parallel to the first direction.

4. The apparatus of claim 2, wherein the plurality of anodes is arranged in a straight line and the transiting device is configured to successively carry each anode into and out of the working position and along a second direction.

5. The apparatus of claim 4, wherein the first direction is substantially perpendicular to the second direction.

6. The apparatus of claim 1, wherein the plurality of anodes is arranged in a ring and the transiting device is configured to successively carry each anode into and out of the working position.

7. The apparatus of claim 6, wherein the plurality of anodes rim the cathode target and the transiting device is rotatable with respect to the cathode target.

8. The apparatus of claim 6, wherein the plurality of anodes near the cathode target and the transiting device is rotatable without respect to the cathode target.

9. The apparatus of claim 1, wherein an interval between the working position and the cathode target is about 0.5 cm to 5 cm.

10. The apparatus of claim 1, wherein each anode is rod-shaped and has a length substantially the same as that of the cathode target.

11. The apparatus of claim 10, wherein each anode has a circular, rectangular, or polygonal cross section.

12. The apparatus of claim 1, wherein the pulsed arc discharge device has a working voltage of about 50V to 1000V.

13. The apparatus of claim 1, wherein the pulsed laser device comprises a KrF or ArF excimer laser device.

14. The apparatus of claim 1, wherein the pulsed laser device comprises an Nd-YAG solid state laser device.

* * * * *